United States Patent [19]

Hirai et al.

[11] Patent Number: 4,626,449
[45] Date of Patent: Dec. 2, 1986

[54] METHOD FOR FORMING DEPOSITION FILM

[75] Inventors: Yutaka Hirai; Hiroshi Echizen, both of Tokyo; Masafumi Sano, Kawasaki; Hisanori Tsuda, Atsugi; Katsuji Takasu, Asaka, all of Japan

[73] Assignee: Canon Kabushiki Kaisha, Tokyo, Japan

[21] Appl. No.: 792,258

[22] Filed: Oct. 28, 1985

[51] Int. Cl.⁴ .................................................. C23C 11/00
[52] U.S. Cl. ................................... 427/53.1; 427/54.1; 427/86; 427/93; 427/94
[58] Field of Search ................. 427/53.1, 54.1, 86, 427/82, 93, 94

[56] References Cited

U.S. PATENT DOCUMENTS

| 3,661,637 | 5/1972 | Sirtl | 427/53.1 |
| 4,340,617 | 7/1982 | Deutsch et al. | 29/572 |
| 4,476,154 | 10/1984 | Iesaka et al. | 427/53.1 |
| 4,568,565 | 2/1986 | Gupta et al. | 427/53.1 |
| 4,581,249 | 4/1986 | Kamiya | 427/54.1 |

Primary Examiner—John H. Newsome
Attorney, Agent, or Firm—Fitzpatrick, Cella, Harper & Scinto

[57] ABSTRACT

A method for forming a deposition film by introducing a starting gas for formation of a deposition film into a reaction chamber housing a substrate therein and forming a deposition film on the substrate by irradiation with light comprises performing deposition by using a monochromatic light and a continuous polychromatic light in combination and projecting the lights on the substrate on which the deposition film is to be formed.

12 Claims, 2 Drawing Figures

EXCITED ENERGY LEVEL OF STARTING GAS

TWO PHOTON ABSORPTION ENERGY USED IN THE PRIOR ART METHOD

TWO PHOTON ABSORPTION ENERGY USED IN THE PRESENT INVENTION

METHOD FOR FORMING DEPOSITION FILM

BACKGROUND OF THE INVENTION

1. Field of the Invention

This invention relates to a method for forming a deposition film, which is suitable for formation of deposition films, above all functional films, particularly amorphous or crystalline deposition films for constituting semiconductor devices, photosensitive devices for electrophotography, line sensors for image inputting, image pickup devices, photovoltaic elements, etc.

2. Description of the Prior Art

The optical CVD method, in which a gas containing a depositing material element for a deposition film is decomposed photochemically by irradiation of a light energy such as UV-ray to form a deposition film on a substrate by use of molecular or atomic active species formed by dissociation of the gas, has been known as a technique for forming a deposition film at a low temperature.

For example, as the optical CVD method for forming silicon films of non-doped or doped hydrogenated amorphous silicon, etc., there have been attempted the methods in which silane gas ($SiH_4$) is decomposed directly with excimer laser of, for example, argon fluoride (ArF), krypton fluoride (KrF), etc.

Whereas, such optical CVD methods of the prior art involve some problems in practical application, above all two important problems that (1) a film is deposited on the window through which a light is introduced into the reaction chamber where deposition of a film is to be effected on a substrate, whereby the light cannot reach the substrate and that (2) light absorption cannot efficiently be done even if the light may reach the substrate.

As a measure against the problem (1) among these problems, it is possible to use the method, as reported in Spring Season Meeting of Society of Applied Physics of Japan, 1984, in which ArF excimer laser with longer wavelength (wavelength 193 nm) than the upper limit of absorbed wavelength of silane 170 nm (corresponding to 7.3 eV) is used as the light source, thereby enhancing dramatically the light intensity in the vicinity of the substrate relative to the vicinity of the window. According to this method, the so called two photon absorption reaction, in which a silane molecule absorbs two photons of ArF excimer laser (corresponding to 6.4 V) at the same time, will become prevailing, while the one photon absorption reaction will become prevailing in the vicinity of the window. As the result, of the reactions which dissocisate silane molecules to form active species such as $SiH^*$, $SiH_2^*$, $Si^*$, $H^*$, etc., the activation energy 7.3 eV necessary for forming the active species $SiH_2^*$ according to the following reaction giving the threshold value:

$$SiH_4 \rightarrow SiH_2^* + H_2$$

is surpassed only in the case of the two photon absorption, namely the reaction in the vicinity of the substrate, and no silicon film will be deposited on the window.

However, according to this method of laser two photon absorption, the above problem (2) of light absorption efficiency cannot be solved. Shortly speaking, in the case of two photon absorption by laser, if excitation energy levels of the gas containing film depositing material element such as $SiH_4$ are expressed by $E_n$ (n=1, 2, 3 . . . ) and the photon energy of laser are expressed by $E_p$, resonance absorption will occur only when:

$$E_n = 2E_p,$$

and the light absorption efficiency is low at other energy levels.

More specifically, as schematically shown in FIG. 2, if the excitation energy levels of the gas containing film depositing material element are expressed as $E_1$, $E_2$, $E_3$, $E_4$, etc. in the order of energy required for the activation reaction from the lower energy side, for example, when the energy $E_p$ of laser was selected in conformity with the Level of $E_3$ to exite two photon absorption, the absorption efficiency was low in the case of $2E_p \neq E_3$ to give no sufficient deposition speed. This is the same when $2E_p$ was conformed to any of $E_1$, $E_2$ and $E_4$.

Accordingly, one may consider to excite two photon absorption by use of a continuous polychromatic light such as Xe lamp in place of laser which is monochromatic light. However, in this case, by use only of a Xe lamp, which is low in luminance of the light source, no satisfactory deposition speed can be obtained.

SUMMARY OF THE INVENTION

An object of the present invention is to cancel the problems posessed by the method for forming a deposition film of the prior art according to the optical CVD method and provide a method for forming a deposition film which can form a deposition film by effecting light absorption of good efficiency by the starting gas, thereby enhancing the deposition speed.

According to the present invention, there is provided a method for forming a deposition film by introducing a starting gas for formation of a deposition film into a reaction chamber housing a substrate therein and forming a deposition film on the substrate by irradiation with light, which comprises performing deposition by using a monochromatic light and a continuous polychromatic light in combination and projecting the lights on the substrate on which the deposition film is to be formed.

DESCRIPTION OF THE PREFERRED EMBODIMENTS

Figure 1:
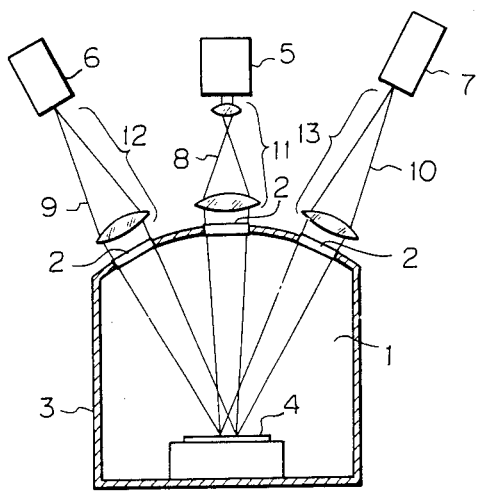
FIG. 1 is a schematic illustration of one example of the device for forming a deposition film which can be used for the method of the present invention.

According to the method for forming a deposition film of the present invention, by selecting and using adequately the starting gases depending on the utilized purpose of the deposition film to be formed, it is possible to form a deposition film with a desired chemical composition in which one or more kinds of the film depositing material elements are combined. For example, as the deposition film to be formed with silicon as one of the film depositing material elements, silicon films such as hydrogenated amorphous silicon film, polycrystalline silicon film, etc., amorphous silicon germanium film, silicon oxide film, silicon nitride film, silicon carbide film, etc., may be included. Further, as the deposition film to be formed with germanium as one of the film depositing material elements, there may be included hydrogenated amorphous germanium film, polycrystalline germanium film, germanium oxide film, gemanium nitride film, germanium carbide film, and the like.

Referring now to the drawing, an example in the case of forming a silicon film by use of a silane compound as the starting material is to be described.

FIG. 1 is a schematic illustration of an example of the device for forming a deposition film to be used in the method of the present invention.

In FIG. 1, 1 is a reaction chamber for forming a deposition film, which is surrounded by a closed vessel 3 equipped with quartz windows 2, 2, 2 for introduction of light into the chamber. In the reaction chamber 1 is internally housed a substrate 4 for formation of deposition film, and the chamber is internaly filled with a gas of a silane compound such as silane ($SiH_4$), disilane ($Si_2H_6$), trisilane ($Si_3H_8$), etc.

In FIG. 1, 5 is a monochromatic light source and laser can preferably be used. 6 and 7 are light sources of continuous polychromatic lights and there may be included, for example, a xenon lamp, a xenon mercury lamp, a deuterium lamp, and the like. UV-rays 8, 9 and 10 from these light sources are projected on a substrate 4 on which a deposition film is to be formed, at which time they are rectified at the beam rectifying optical systems 11, 12 and 13, respectively, transmitted through the quartz windows 2, 2, 2, to be preferably converged and projected on the desired portion or whole of the substrate 4. As the monochromatic light 5, any light having an oscillation wavelength in the UV-region may be available, and may be selected adequately in view of the light absorption wavelength band, the photon energy quantity, etc. of the silane compound to be employed.

For example, when a deposition film is to be formed by two photon absorption by use of disilane which is shifted in the light absorption wavelength band to the longer wavelength side than silane, it is preferable to use krypton fluoride (KrF) excimer laser (photon energy $E_p$: corresponding to 4.98 eV), xenon chloride (XeCl) excimer laser ($E_p$: corresponding to 4.03 eV), xenon fluoride (XeF) excimer laser ($E_p$: corresponding to 3.53 eV), etc., particularly preferably KrF excimer laser with a high average laser output. On the other hand, as the continuous polychromatic light sources 6, 7, it is highly recommended to use an ellipsoidal mirror built-in type Xe lamp. If the photon energy of such a KrF excimer laser 5 is expressed by $E_p$, the photon energy of Xe lamps 6, 7 by $E_{PX}$ and the threshold value of the activation energy for dissociating the disilane molecule by $E_{th}$, they have the following values:

$$E_p = 4.98 \text{ eV}$$

$$E_{PX} \leq 6.2 \text{ eV}$$

$$E_{th} \gtrsim 6.4 \text{ eV}.$$

Here, when each one photon is absorbed from the light source 5 and the light source 6 or 7, since the light from Xe lamp is continous light, excitation may be possible to any energy level at the region within:

$$4.98 \text{ eV} \leq E_p + E_{PX} \leq 11.18 \text{ eV}.$$

Figure 2:
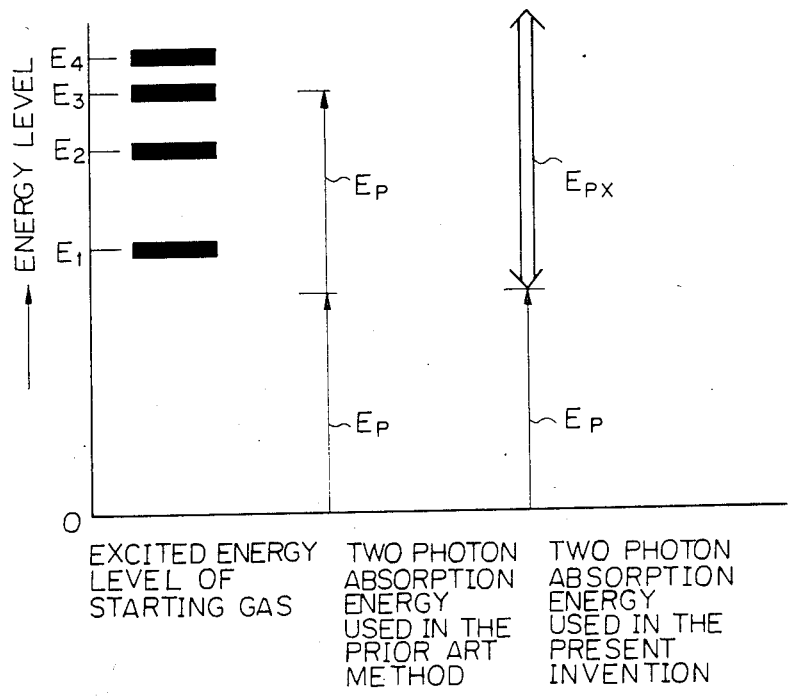
FIG. 2 is a schematic energy chart for explanation of correspondence of the excitation energy levels of the starting gas to the photon energy of the projected light.

This is schematically shown in FIG. 2, and in this case, resonance absorption can occur to the respective energy levels such as $E_1 (=E_{th})$, $E_2$, $E_3$, $E_4$, . . . etc., whereby the deposition speed can be improved by light absorption with good efficiency.

It is preferable for more efficient light absorption and prevention of one photon absorption by laser that $E_p$ should satisfy the condition of $E_p < E_{th}$ as in this examples. Also, as for $E_{PX}$, although the influence of this on one photon absorption may be little, it should desirably satisfy the condition of $E_{PX} < E_{th}$.

Also, in the device shown in FIG. 1, two ellipsoidal mirror built-in type Xe lamps 6, 7 have been employed for the effects of enhancing the intensity of incident light and enhancing the deposition speed. These effects are backed up by the knowledge that "The transition probability of two photon absorption is proportional to the product of the two incident light intensities". (see "Laser Handbook, Chapter 36, Application for chemistry", edited by Society of Laser, p. 739).

When the present invention was actually practiced, a deposition speed of 25 Å/sec is obtained by using, for example, disilane (charging pressure 0.1 Torr) as the starting gas, KrF laser with an output of 100 mW/cm² as the laser, and an ellipsoidal mirror built-in type Xe lamp of 1 KW as the Xe lamp, for deposition of a silicon film on a white glass substrate (substrate temperature 80° C.).

As compared with the above embodiment, according to the prior art method, when a silicon film was deposited in the same manner as in the above embodiment except for performing two photon absorption with KrF laser, the deposition speed was 12 Å/sec The method of the present invention, since formation of a deposition film can be performed with good efficiency by utilizing at high efficiency the energy of UV-ray according to the optical CVD method, can be very advantageous in production of amorphous or crystalline deposition films for constitution of, for example, functional films, particularly of semiconductor devices, photosensitive devices for electrophotography, line sensors for image inputting, image pickup devices, photovoltaic elements, etc.

What we claim is:

1. A method for forming a deposition film by introducing a starting gas for formation of a deposition film into a reaction chamber housing a substrate therein and forming a deposition film on the substrate by irradiation with light, which comprises performing deposition by using a monochromatic light and a continuous polychromatic light in combination and projecting the lights on the substrate on which the deposition film is to be formed.

2. The method according to claim 1, wherein the monochromatic light is laser light.

3. The method according to claim 2, wherein the laser is krypton fluoride (KrF) excimer laser.

4. The method according to claim 2, wherein the laser is xenon chloride (XeCl) excimer laser.

5. The method according to claim 2, wherein the laser is xenon fluride (XeF) excimer laser.

6. The method according to claim 1, wherein the continuous polychromatic light is light of a xenon lamp.

7. The method according to claim 2, wherein the laser light is selected and used so that photon energy $E_p$ of the laser may be related to the threshold value $E_{th}$ of the activation energy necessary for forming the active species by dissociation of the starting gas as follows:

$$E_p < E_{th}.$$

8. The method according to claim 7, wherein disilane (Si$_2$H$_6$) is used as the starting gas and KrF excimer laser is used as the laser.

9. The method according to claim 6, wherein the xenon lamp is an ellipsoidal mirror built-in type xenon lamp.

10. The method according to claim 1, wherein the light from the light source is converged and projected on the substrate.

11. The method according to claim 1, wherein the continuous polychromatic light is the light of a xenon mercury lamp.

12. The method according to claim 1, wherein the continuous polychromatic light is the light of a deuterium lamp.

* * * * *